(12) United States Patent
Plyvänäinen

(10) Patent No.: US 7,275,008 B2
(45) Date of Patent: Sep. 25, 2007

(54) CALIBRATION OF 3D FIELD SENSORS

(75) Inventor: Timo Pekka Plyvänäinen, Tampere (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/251,434

(22) Filed: Oct. 14, 2005

(65) Prior Publication Data

US 2007/0055468 A1 Mar. 8, 2007

Related U.S. Application Data

(63) Continuation-in-part of application No. 11/219,576, filed on Sep. 2, 2005, now abandoned.

(51) Int. Cl.
*G01C 17/38* (2006.01)

(52) U.S. Cl. .......................... 702/92; 324/202; 702/93

(58) Field of Classification Search ................ 702/92, 702/93, 94, 95, 104, 150, 151, 153, 188; 324/202, 226, 245–247, 330; 33/333, 356; 356/477; 340/573.1; 701/224

See application file for complete search history.

(56) References Cited

U.S. PATENT DOCUMENTS

| | | | | |
|---|---|---|---|---|
| 4,870,602 | A | * | 9/1989 | Baumker .................. 702/93 |
| 5,117,375 | A | * | 5/1992 | Worcester et al. .......... 702/92 |
| 5,243,403 | A | * | 9/1993 | Koo et al. ............... 356/477 |
| 6,014,610 | A | | 1/2000 | Judge et al. .............. 702/92 |
| 6,278,271 | B1 | * | 8/2001 | Schott .................. 324/251 |
| 2004/0149004 | A1 | | 8/2004 | Wu ........................ 73/1 |
| 2006/0164073 | A1 | * | 7/2006 | Bergsma ................. 324/202 |

FOREIGN PATENT DOCUMENTS

| | | |
|---|---|---|
| EP | 0 756 179 A2 | 1/1997 |
| WO | WO 2004/041086 A1 | 5/2004 |

OTHER PUBLICATIONS

Turner, D.A. et al., Dec. 1, 1999, "An Algorithm for Fitting an Ellipsoid to Data", 12 pgs.

Kepko, E.L. et al., "Accurate Determination of Magnetic Field Gradients from Four Point Vector Measurements—Part 1: Use of Natural Constraints on Vector Data Obtained from a Single Spinning Spacecraft", Mar. 1996, IEEE Transactions on Magnetics, vol. 32, No. 2, p. 377-385.

(Continued)

*Primary Examiner*—John Barlow
*Assistant Examiner*—John Le
(74) *Attorney, Agent, or Firm*—Harrington & Smith, PC

(57) ABSTRACT

An apparatus-based method is disclosed for calibration of a 3D field sensor. The method includes accessing a plurality of samples, where the samples are from the 3D field sensor. Each sample represents a magnitude and an orientation of a three-dimensional field sensed by the 3D field sensor. Using the plurality of samples, a plurality of parameters is determined of an ellipsoid. The determination of the plurality of parameters is performed so that the ellipsoid fits the plurality of samples. A transformation is determined that transforms the ellipsoid into a sphere. The transformation is applied to a sample to create a transformed sample. Apparatus and signal bearing media are also disclosed.

40 Claims, 6 Drawing Sheets

OTHER PUBLICATIONS

Farrell, W.M. et al., Mar. 1995, "A Method of Calibrating Magnetometers on a Spinning Spacecraft", IEEE Transactions on Magnetics, vol. 31, No. 2, p. 966-972.

Gebre-Egziabher et al., 2001, International Conference on Integrated Nav. Systems, "A Non-Linear, Two-Step Estimation Algorithm for Calibrating Solid-State Strapdown Magnetometers", 10 pgs.

Alonso, R. et al., Oct.-Dec. 2002, "Attitude-Independent Magnetometer-Bias Determination: A Survey", The Journal of the Astronautical Sciences, vol. 50, No. 4, p. 453-475.

Alonso, R. et al., Oct.-Dec. 2002, "Complete Linear Attitude-Independent Magnetometer Calibration", The Journal of the Astronautical Sciences, vol. 50, No. 4, p. 477-490.

Graven, P. et al., 1996, Proc. Of the 10th Annual AIAA/USU Small Satellite Conf., "Laboratory (and On-Orbit) Magnetometer Calibration without Coil Facilities or Orientation Information", p. 1-8.

Crassidis, J.L. et al., "Real-Time Attitude-Independent Three-Axis Magnetometer Calibration", Journal of Guidance, Control, and Dynamics (2005), 0731-5090, vol. 28 No. 1, 115-120.

Hoff, B. et al., Oct. 5-6 2000, Pro. Of International Symposium on Augmented Reality, "Autocalibration of an Electronic Compass in an Outdoor Augmented Reality System", 6 pgs.

* cited by examiner

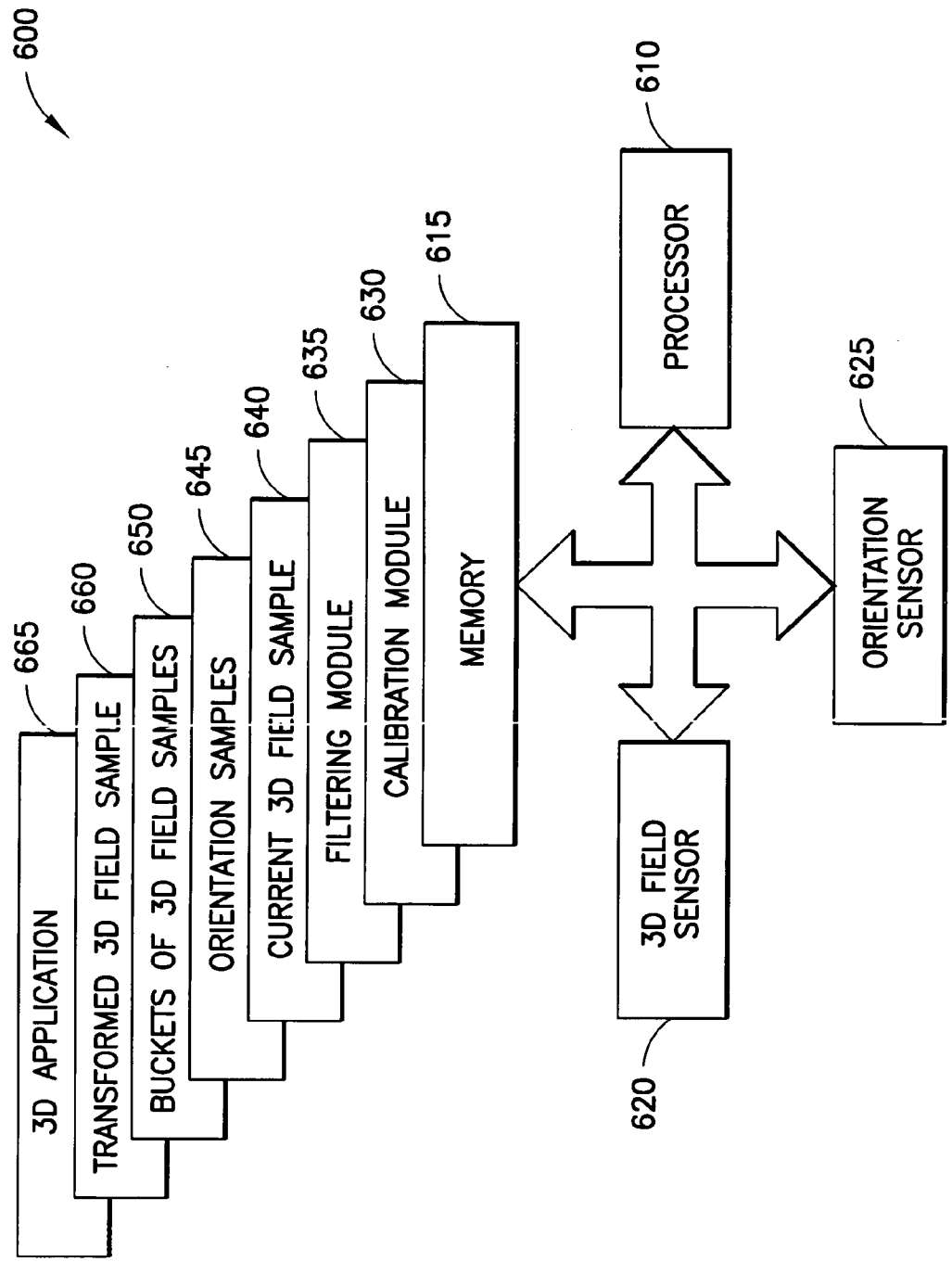

CALIBRATION OF 3D FIELD SENSORS

CROSS-REFERENCE TO RELATED APPLICATIONS

This application is a continuation in part of U.S. patent application Ser. No. 11/219,576, filed on Sep. 2, 2005 now abandoned, which is herein incorporated by reference.

TECHNICAL FIELD

This invention relates generally to sensors that measure three-dimensional (3D) fields and, more specifically, relates to calibration of such sensors.

BACKGROUND OF THE INVENTION

A 3D field sensor is a sensor that measures direction and magnitude of some field in three-dimensional (3D) space. For example three orthogonal magnetometer elements can measure the direction and magnitude of the surrounding magnetic field. Similarly, three orthogonal accelerometer elements can sense the direction and magnitude of acceleration or more importantly the gravitational field, which is typically indistinguishable from acceleration.

As already suggested above, in almost all cases, a 3D field sensor includes at some level three single-dimensional sensors oriented appropriately relative to each other. The basic assumption in reconstructing the direction and magnitude of the measured field is that these elements are orthogonal to each other and have similar scales and bias of zero.

In practice, however, these assumptions are rarely valid. Magnetometers are especially tricky, because external magnetic components attached to a device in which the magnetometer resides can result in scale and offset errors and can also effectively introduce linear dependence among the measuring axes.

To counteract these problems, calibration of the 3D field sensor is needed. Usually this process is lengthy and generally involves complicated steps for the user. For example, to find the scale of an axis, it is usually required to find the maximum and minimum value that the field can produce on that axis. This process also gives the offset, but cannot find possible linear dependence among different axes. To find possible linear dependence among different axes, it is usually required to indicate certain reference directions, which is also time consuming for the user.

As another example, a traditional way of calibrating an electronic compass is by comparing measured headings to known headings and building a lookup table. To have an accurate heading, this process must be performed whenever the device is moved to a new location. Unfortunately, 3D magnetometers are relatively new, and most calibration methods are for 2D sensors. Automatic calibration methods have been based on Kalman filtering, in for example: Bruce Hoff, Ronald Azuma: "Autocalibration of an Electronic Compass in an Outdoor Augmented Reality System", Proceedings of IEEE and ACM Int'l Symposium on Augmented Reality 2000 (2000). This process still takes user input regarding known headings and is typically impractical for 3D field sensors.

It would therefore be desirable to provide techniques that can calibrate 3D field sensors with little if any user input.

BRIEF SUMMARY OF THE INVENTION

The present invention provides techniques that calibrate 3D field sensors.

In an exemplary embodiment of the invention, an apparatus-based method is disclosed for calibration of a 3D field sensor. The method comprises accessing a plurality of samples, where the samples are from the 3D field sensor. Each sample represents a magnitude and an orientation of a three-dimensional field sensed by the 3D field sensor. Using the plurality of samples, a plurality of parameters is determined of an ellipsoid. The determination of the parameters is performed so that the ellipsoid fits the plurality of samples. A transformation is determined that transforms the ellipsoid into a sphere. The transformation is applied to a sample to create a transformed sample.

In another exemplary embodiment, a signal bearing medium is disclosed that tangibly embodies a program of machine-readable instructions executable by a processor to perform operations for calibration of a three-dimensional (3D) field sensor. The operations include accessing a plurality of samples, where the samples from the 3D field sensor. Each sample represents a magnitude and an orientation of a three-dimensional field sensed by the 3D field sensor. Using the plurality of samples, a determination is made of a plurality of parameters of an ellipsoid. The determination of the plurality of parameters is performed so that the ellipsoid fits the plurality of samples. A transformation is determined that transforms the ellipsoid into a sphere. The transformation is applied to a sample to create a transformed sample.

In another exemplary embodiment, an apparatus is disclosed that includes a means for measuring a three-dimensional (3D) field and for producing samples representing a magnitude and an orientation of the three-dimensional field. The apparatus also includes means for accessing a plurality of samples from the means for measuring. The apparatus further includes means, responsive to the plurality of samples, for determining a plurality of parameters of an ellipsoid, wherein the determining of the plurality of parameters is performed so that the ellipsoid fits the plurality of samples. The apparatus additionally has means for determining a transformation that transforms the ellipsoid into a sphere and has means for applying the transformation to a sample to create a transformed sample.

In a further exemplary embodiment, another apparatus is disclosed that includes a three-dimensional (3D) field sensor. The 3D field sensor is adapted to produce field samples, where each field sample represents a magnitude and an orientation of a 3D field sensed by the 3D field sensor. The apparatus includes a calibration module adapted to access a plurality of the field samples from the 3D field sensor. The calibration module is adapted to use the plurality of samples to determine a plurality of parameters of an ellipsoid, wherein the determining the plurality of parameters operation is performed so that the ellipsoid fits the plurality of field samples. The calibration module is further adapted to determine a transformation that transforms the ellipsoid into a sphere and to apply the transformation to a field sample to create a transformed field sample.

BRIEF DESCRIPTION OF THE DRAWINGS

The foregoing and other aspects of embodiments of this invention are made more evident in the following Detailed Description of Exemplary Embodiments, when read in conjunction with the attached Drawing Figures, wherein:

FIG. 6 is a block diagram of an apparatus including a 3D field sensor and modules for calibration of the 3D field sensor.

DETAILED DESCRIPTION OF EXEMPLARY EMBODIMENTS

Figure 1:
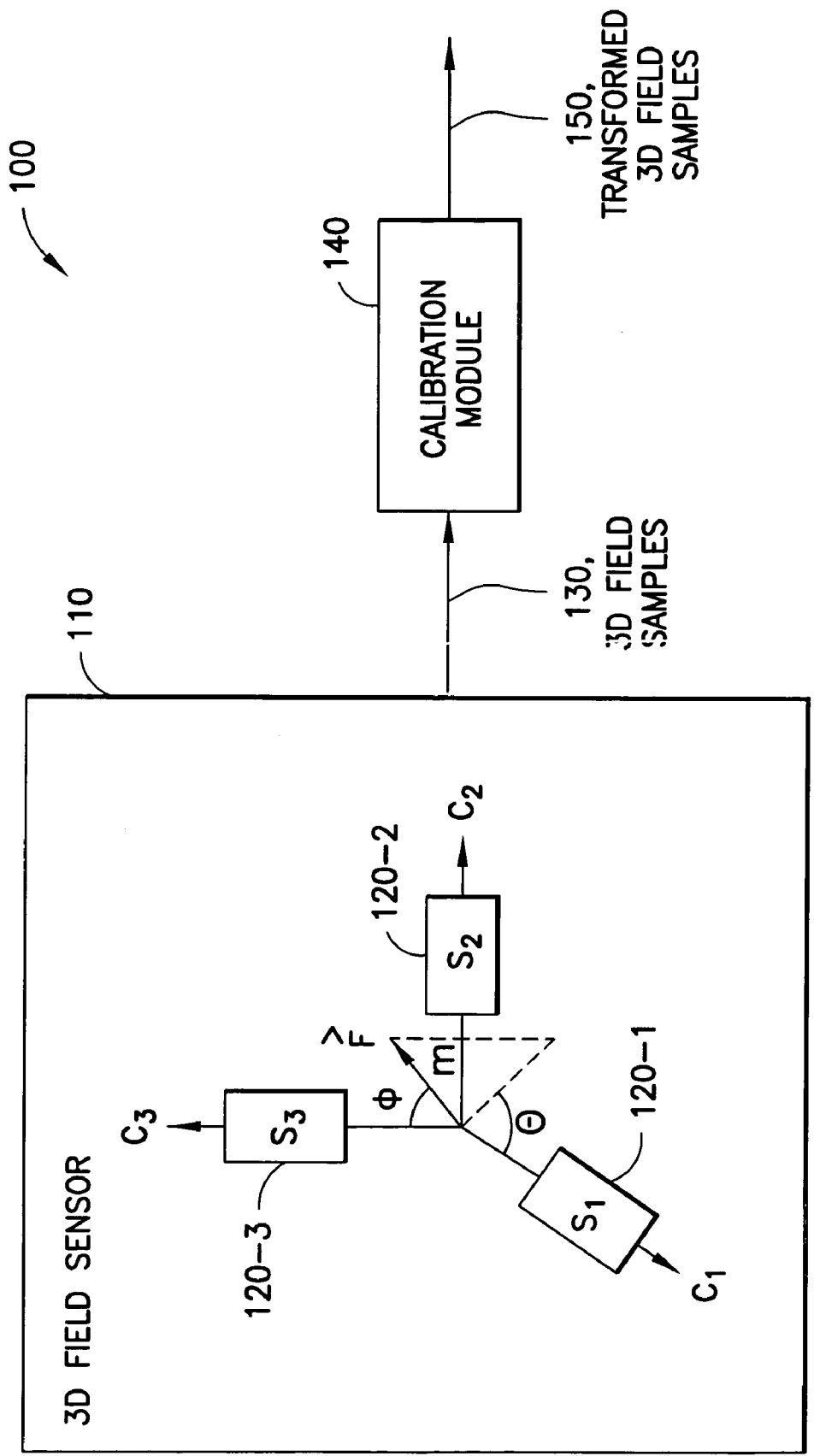
FIG. 1 is a block diagram of an exemplary apparatus for calibrating a 3D field sensor.

For ease of reference, the present disclosure is divided into a number of different sections.

1. Introduction

The present disclosure is primarily directed to calibrations of 3D field sensors such as three-axis magnetometers (TAM), but in principle the techniques herein can be applied to any three-axis sensor that is used to sense a linear field. Examples of such sensors could be a three-axis accelerometer sensing the earth's gravity or a sensor sensing an electric field in three dimensions.

Of course, there is any number of straightforward ways of calibrating such a sensor with some kind of reference signal(s). Our setting, however, is different. A TAM can be used in conjunction with a three-axis accelerometer to obtain the orientation of the device in reference to the coordinate system set by the earth's gravitational and magnetic fields. In astronautical sciences, this is usually called the attitude of the spacecraft. We, however, are interested in the orientation of apparatus including hand held devices, such as mobile phones or game controllers. Such devices typically use inexpensive magnetometers and as a result the calibration is likely to drift in time. We therefore need an adaptive calibration that is invisible to the user.

A similar problem is faced with space crafts that are interested in measuring the earth's magnetic field. The calibration is likely to change due to the harsh conditions of take off and the different atmosphere in orbit. Fully known reference signals are not available in orbit either. There is a wealth of literature on the calibration of TAM for satellite systems.

In tests, we have observed that the calibration of a device is dependent on the location of the device. The calibration can be subject to significant changes when the device is moved as little as few meters in some direction. It is not surprising that the direction and magnitude of the magnetic field can change in such a short range, especially within buildings. Paramagnetic elements in buildings can strengthen the earth's magnetic field in one direction and electrical wiring may induce new magnetic fields. This should not, however, affect the calibration of the device sensing the field. One explanation might be that the paramagnetic components inside the device, near the magnetometers, affect the calibration differently depending on the strength of the observed field. Whatever the reason, this is observed behavior and one more reason for easy adaptive calibration.

Nevertheless, exemplary calibration herein is based on the assumption that the magnetic field is constant for sufficiently long time windows. This is in contrast with the problem for satellite systems, where the spacecraft travels in orbit and the magnetic field changes significantly in the course of one revolution around the earth. In the satellite systems case, some model of the earth's magnetic field is usually used. There is a significant difference between calibration for satellite systems and calibration for handheld devices. Obviously, when the device is rotated within the magnetic field, the sensed field is rotated in the coordinate system of the device. When the actual field is assumed to have a constant direction, then the relative angles of consecutive measurements contain information. If, however, the direction of the outside field may have changed as well, then this information may be lost. We will show that with an assumption of constant field, it is easy to determine a decoupling matrix for the calibration as well.

In the present disclosure, we discuss the calibration of a sensor that measures any 3D field, such as magnetic, gravitational or electric field. For instance, turning to FIG. 1, an exemplary apparatus 100 is shown for calibrating a 3D field sensor 110. The 3D field sensor 110 includes three single-dimensional sensors 120-1, 120-2, and 120-3 ($s_1$, $s_2$, and $s_3$, respectively), each of which is parallel to an axis $\vec{c}_1$, $\vec{c}_2$, or $\vec{c}_3$, which are orthogonal axes. Each sensor 120 measures an axial component of the field $\vec{F}$, which has a magnitude, m, and a direction, d. In the example of FIG. 1, the direction, d, is related by the angles θ, in the $\vec{c}_1$, $\vec{c}_2$ plane, and φ, an angle relative to the $\vec{c}_3$ axis.

The 3D field sensor 110 produces 3D field samples 130, each of which could comprise spherical values (m,θ,φ) or field values (x, y, z) for each sensor 120-1, 120-2, and 120-3, respectively. From field values (x,y,z), the magnitude and direction of the field can be determined. Note the 3D field sensor 110 is merely exemplary and used for exposition. The calibration module 140 operates on the 3D field samples 130 to create transformed 3D samples 150. The transformed 3D samples 150 should reduce or eliminate scale, offset, and other linear errors from the 3D field sensor 110.

Figure 2:
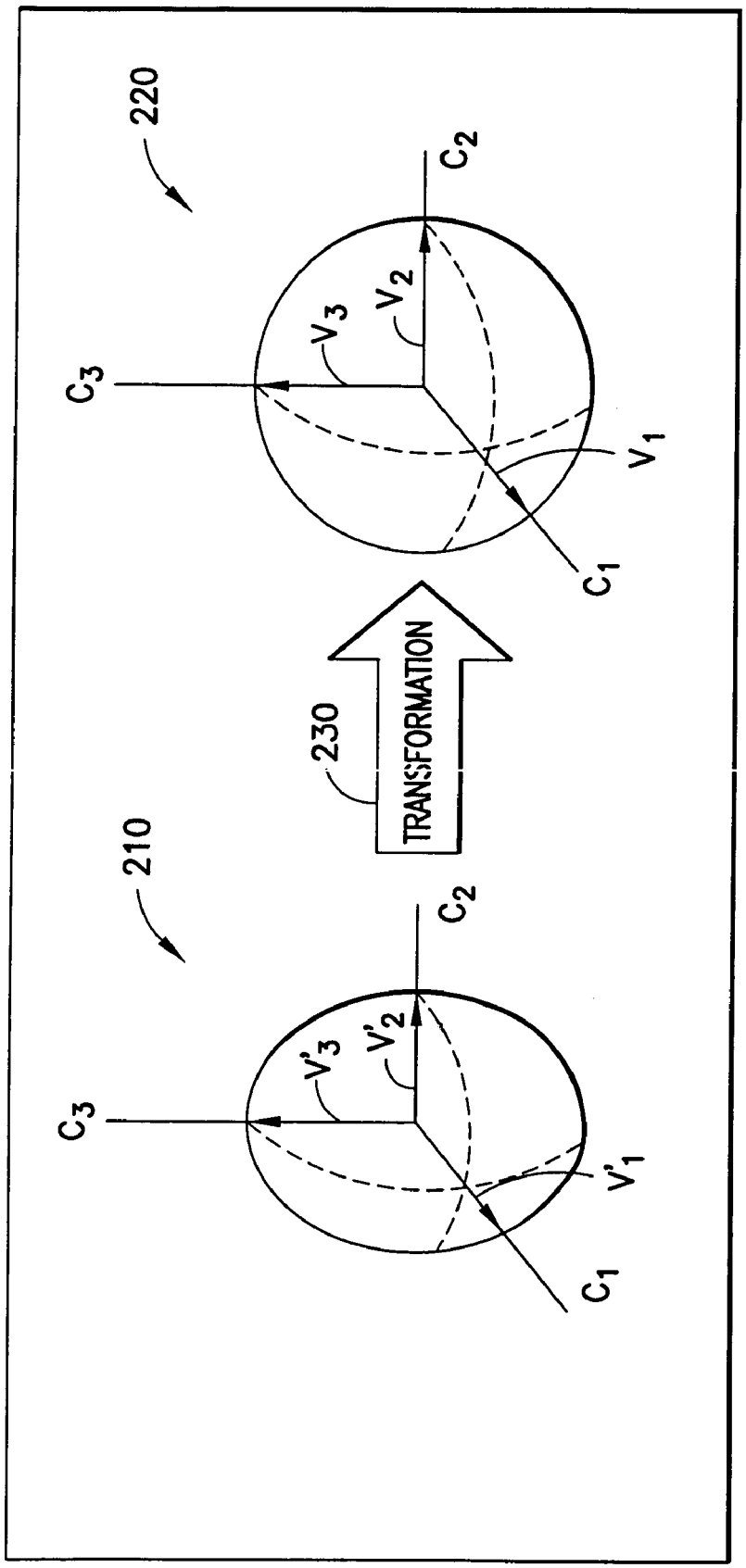
FIG. 2 is an exemplary representation of a transformation from an ellipsoid to a sphere.

When a sensor is measuring a constant 3D field (e.g., field $\vec{F}$), it can be assumed that all measurements (e.g., as defined by 3D field samples 130) from the 3D field sensor 110 should fall on the unit sphere. For instance, when a 3D field sensor 110 is rotated in a constant field, the measurements from the sensor 110 should lie on a spherical surface. This is shown graphically in FIG. 2 as unit sphere 220. The vectors $\vec{v}_1$, $\vec{v}_2$, $\vec{v}_3$ should all be the same length in this example, and therefore measurements from 3D field sensor 110 should fall on the unit sphere 220. But misaligned sensor axes (e.g., axes $\vec{c}_1$, $\vec{c}_2$, and $\vec{c}_3$), biases and scale errors will transform that sphere 220 into a quadratic surface, illustrated as exemplary ellipsoid 210, where one or more of the vectors $\vec{v}_1{'}$, $\vec{v}_2{'}$, $\vec{v}_3{'}$ are not equivalent to their corresponding vectors $\vec{v}_1$, $\vec{v}_2$, $\vec{v}_3$. Thus, one can fit a quadratic surface (e.g., ellipsoid 210) to the data (not shown in FIG. 2) from 3D field sensors 110 and find an inverse transformation that will turn that quadratic surface into a sphere. This process will then also make the measured data (e.g., the 3D field samples 130) spherical and thus this process has removed any offset, scale, and linear dependence of the 3D field sensor 110.

A model of the distortion herein is therefore is a quadratic surface such as ellipsoid 210, and the calibration module 140 finds the transformation 230 that brings that ellipsoid 210 back to the unit sphere 220. This process may be performed adaptively and computationally effectively—in real time, as new samples are collected. In particular, disclosed below is an exemplary method that can find a best fitting distortion (e.g., ellipsoid 210) recursively, so that relatively little computation is needed per new sample added to a set of samples used for calibration. This means that the calibration can be done online, during normal operation, hidden from the user, and the calibration can adapt to changes automatically without need for explicit recalibration.

The exemplary methods presented herein can determine the distortion (e.g., ellipsoid 210) from very little data. In particular, a reasonable calibration can be obtained without ever actually rotating a device a full turn. This is advantageous for example in mobile phones, where the orientation of the device is such that the screen is always facing the user and rarely away from the user. Also, the present invention has removed any explicit calibration step (unless such a step is desired), as the calibration can be updated from almost random data during operation.

In addition to offset and scale errors, 3D field sensor elements often suffer from non-linearity. The disclosed methods herein are generally unable to correct for non-linearities and may work incorrectly if measurements from a 3D field sensor 110 are highly non-linear.

Figure 3:
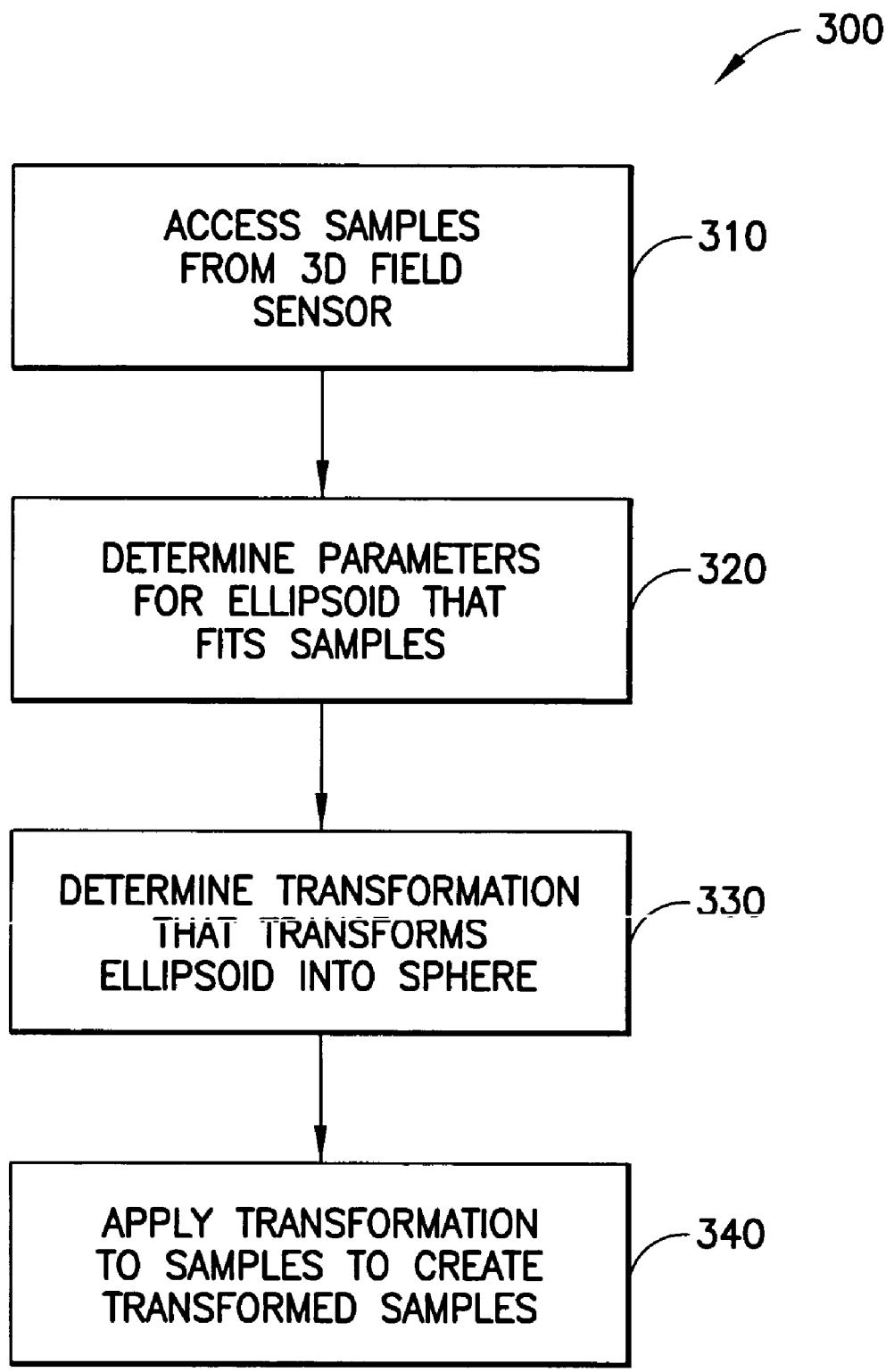
FIG. 3 is a flowchart of an exemplary method for calibrating a 3D field sensor.

A short introduction will now be given to FIG. 3, which is a method 300 performed by the calibration module 140 for calibrating the 3D field sensor 110. More detailed description is given below. Briefly, the calibration module 140 accesses 3D field samples 130, which could be accessed for example from a memory (e.g., as shown in FIG. 6) or from the 3D field sensor 110. This occurs in step 310. The samples could be in any form suitable for describing a 3D field, but will typically be field values (x,y,z) for each sensor 120-1, 120-2, and 120-3, respectively. In step 320, the calibration module 140 determines parameters for an ellipsoid (e.g., ellipsoid 210 of FIG. 2) that fits the 3D field samples 130. In step 330, a transformation is determined that transforms the ellipsoid into a sphere (e.g., unit sphere 220). In step 340, the transformation is applied to 3D field samples 130 to create transformed 3D samples 150. The transformed 3D samples 150 are therefore calibrated.

2. Distortion Model

It is assumed that a sensor measurement process can be modeled as the projection of the real field vector (e.g., field $\vec{F}$) on to the sensor axes and then adding an arbitrary offset. In formulas one can say that if $\vec{c}_1$, $\vec{c}_2$, and $\vec{c}_3$ are the axes of the sensor, where their lengths represent a possible scale error, then the measurement process of the unit field $\vec{u}$ is represented as $$\vec{m} = C\vec{u} + \vec{b} + \vec{\epsilon}, \quad (1)$$

where the rows of C are the $\vec{c}_i$, $\vec{b}$ is an arbitrary bias, and $\vec{\epsilon}$ is random measurement noise. Given $\vec{m}$, we are interested in knowing $\vec{u}$, so we need to know $\vec{b}$ and $D=C^{-1}$.

Since $\|\vec{u}\|=1$, we have from (1) that $$\left\|D(\vec{m}-\vec{b})\right\|^2 = \|\vec{u}-D\vec{\epsilon}\|^2 \quad (2)$$
$$= \|\vec{u}\|^2 + 2\vec{u}^T D\vec{\epsilon} + \vec{\epsilon}^T D^T D\vec{\epsilon}$$
$$= 1 + \epsilon'.$$

The points $\vec{m}$ that satisfy (2) for $\epsilon'=0$ form an ellipsoid, so it is beneficial to look for ellipsoid methods to solve for $\vec{m}$.

While $\epsilon'$ is a random variable, $\vec{u}$ has some unwanted properties. Namely, if the random variables $\vec{u}$ and $\vec{\epsilon}$ independent and zero mean, then $E[\epsilon']=2E[\vec{u}^T D \vec{\epsilon}]+E[\|D\vec{\epsilon}\|^2] \geq 0$. So a least squares estimate may not be unbiased. Further $\epsilon'$ depends on the very parameters we are trying to estimate. On the other hand, it is not uncommon in engineering to make assumptions about errors and in the limit as $\epsilon$ goes to zero this method provides the correction parameters exactly, so we ignore this problem and move on.

Notice that the resulting calibration parameters D and b only give a sort of relative calibration. With this correction, a rotation of a degrees about some axis results in a $\alpha$ degree turn in the corrected measurements. However, if D satisfies (2) then for any matrix R such that $R^T R=I$, we have that RD also satisfies (2). So the actual orientation of the device relative to some reference coordinate system may actually be further lost as a result of the calibration. This problem, however, is addressed in section 5.

3. Fitting an Ellipsoid to Data

In a paper by D. A. Turner, I. J. Anderson, and J. C. Mason, entitled *An algorithm for fitting an ellipsoid to data*, Technical Report RR9803, School of Computing and Mathematics, University of Huddersfield (1999) (called "Turner" herein), the authors describe a method of fitting an ellipsoid to data using linear regression. The fitted ellipsoid in Turner is not the best fitting ellipsoid in terms of geometrical distance of the points to the surface. In fact, the authors in Turner note that a major drawback of the algorithm is the difficulty in interpreting the residuals that are minimized.

The authors in Turner give justification for the following quadratic form representing an ellipsoid $$x^2+y^2+z^2-U(x^2+y^2-2z^2)-V(x^2-2y^2+z^2)-4Mxy-2Nxz-2Pyz-Qx-Ry-Sz-T=0. \quad (3)$$

A suitable ellipsoid fitting the data is then found in Turner by finding the least squares solution to the linear equation $$\Lambda \vec{s}_{LS} = \vec{e}, \quad (4)$$

where $\vec{s}_{LS}=(U,V,M,N,P,Q,R,S,T)^T$, the ith element of $\vec{e}$ is $x_i^2+y_i^2+z_i^2$ and the ith row of the m×9 matrix $\Lambda$ is $$x_i^2+y_i^2-2z_i^2, x_i^2-2y_i^2+z_i^2, 4x_iy_i, 2x_iz_i, 2y_iz_i, x_i, y_i, z_i, 1. \quad (5)$$

Now an arbitrary ellipsoid can also be written as $$(\vec{x}-\vec{b})^T A(\vec{x}-\vec{b})=c, \quad (6)$$

where A is a symmetric positive definite matrix (and $\vec{x}=(x,y,z)$, e.g., 3D field samples 130 from a 3D field sensor 110) and $\vec{b}$ is a bias and c is a scaling factor. Expand this to get $$\vec{x}^T A\vec{x} - 2\vec{b}^T A\vec{x} + \vec{b}^T A\vec{b} - c = 0. \quad (7)$$

Expand further in terms of the elements of $\vec{x}$ and $\vec{b}$, equate the left hand side (LHS) to the LHS of Eq. (3) and collect terms to get $$A = \begin{pmatrix} 1-U-V & -2M & -N \\ -2M & 1-U+2V & -P \\ -N & -P & 1+2U-V \end{pmatrix}, \quad (8)$$

$$\vec{b} = \frac{1}{2} A^{-1} \begin{pmatrix} Q \\ R \\ S \end{pmatrix}, \quad (9)$$

and the scaling factor is $$c = T + \vec{b}^T A \vec{b}. \quad (10)$$

Observe that equation (6) has more parameters than strictly necessary to define an arbitrary ellipsoid. From Eq. (8), we can see that in Eq. (4) we have restricted ourselves to those ellipsoids for which tr(A)=3, where tr(A) means trace of the matrix A. The equations (8)–(10) are invertible when matrix A satisfies this condition, so the least squares problem of Eq. (4) is then equivalent to $$\min \sum_i \left( (\vec{x}_i - \vec{b})^T A (\vec{x}_i - \vec{b}) - c \right)^2, \quad (11)$$

restricted to those A for which tr(A)=3. Now let $A^*$, $\vec{b}^*$, and $c^*$ be a solution to Eq. (11). Notice that we can make this an unrestricted problem by letting $\alpha_{11} = 3 - \alpha_{22} - \alpha_{33}$. We can see that by scaling $A^*$ and $c^*$ by a constant k we get a solution for the optimization problem Eq. (11) restricted to the set where tr(A)=3/k. This is because $$(\vec{x} - \vec{b})^T \frac{A}{k} (\vec{x} - \vec{b}) - \frac{c}{k} = \frac{1}{k} \left( (\vec{x} - \vec{b})^T A (\vec{x} - \vec{b}) - c \right), \quad (12)$$

so the partial derivatives (after making the problem unrestricted) are also just scaled, but at optimum the partial derivatives are zero, so the solutions are unaffected by this scaling.

In particular, we can select $k = c^*$ and get a solution $(B^*, b^*, 1)$ where $$B^* = \frac{1}{c^*} A^*,$$

to $$\min \sum_i \left( (\vec{x}_i - \vec{b})^T B^* (\vec{x}_i - \vec{b}) - c \right)^2, \quad (13)$$

constrained to matrices $B^*$ such that $$tr(B^*) = \frac{3}{c^*} A.$$

In general, this may not be a solution for the problem in Eq. (11) constrained to c=1 instead of tr(A)=3. We call the problem constrained to c=1 the "transformation problem" herein. We would really want to find the solution of the transformation problem, but this problem generally cannot be linearized as above. We have, however, obtained a point that satisfies this constraint (e.g., of c=1) and is optimal in the sense that the solution cannot be improved without changing the trace of the matrix. In practice this will give good enough solutions to be used in calibration.

Note that equations (11) and (13) are identical, save that the matrix B in equation (13) replaces the matrix A in equation (11). The substantive difference lies in the scale. Solving equation (13) with the constraint $$tr(B^*) = \frac{3}{c^*},$$

where $c^*$ is from the solution to equation (11) with tr(A)=3, maps the samples close to the unit sphere. The solution for equation (11) maps the samples close to a sphere, just not necessarily the unit sphere. Solving equations (4) and (8) to (10) yields a transformation that draws the samples close to a unit sphere. Consider that the transformation obtained by taking $A^*$ by decomposing takes the samples close to some spherical surface, presumably having a radius in the range of $\sqrt{c^*}$. Scaling $A^*$ by $c^*$ yields a transformation, after decomposing, that takes the samples close the spherical surface with unit radius.

It is noted that the scaled solution of equation (11), as represented by equation (13), is also a direct solution to a similar problem, but using an alternate trace condition. Intuitively, this confirms that scaling as in equation (13) maintains whatever optimality is imposed by the more general, unscaled solution of equation (11). Since $c^*$ in the equation (13) condition of $$tr(B) = \frac{3}{c^*}$$

comes from the solution to equation (11), it is clear that equation (13) is but one of several possible scaling solutions, any of which scale for and solve equation (11) remaining within these teachings.

Now decompose $B^*$ so that $B^* = C^T C$ and note that $$(\vec{x} - \vec{c})^T B (\vec{x} - \vec{c}) = (\vec{x} - \vec{c})^T C^T C (\vec{x} - \vec{c}) = \|C(\vec{x} - \vec{c})\|^2, \quad (14)$$

we see that in fact we have found (step 330 of FIG. 3) the transformation (i.e., the matrix C) that maps the data points close to a unit sphere. The transformation matrix C may be applied to samples (in step 340 of FIG. 3) to create transformed samples. However, as pointed out below, it may be beneficial to determine a different version of the transformation matrix C to be applied to samples.

It should be noted that it is possible to solve Eq. (4) directly, which gives the parameters of $\vec{s}_{LS}$ (e.g., step 320 of FIG. 3), and then to use the equations above to determine the transformation matrix C (step 330 of FIG. 3) and to apply the transformation matrix C to 3D field samples 130. However, a recursive method is disclosed in the section below and is more suitable to determining these elements based on real-time, incoming 3D field samples 130.

4. Recursive Updates

The solution to Eq. (4) is well known and is $$\vec{s}_{LS} = (\Lambda^T \Lambda)^{-1} \Lambda^T \vec{e}. \tag{15}$$

This solution corresponds to the solution of $$\vec{s}_{LS} = \min_{\vec{s}_{LS}} \sum_i (\Lambda_i \vec{s}_{LS} - e_i)^2. \tag{16}$$

where $\Lambda_i$ is the ith row of $\Lambda$. In the spirit of the Recursive Least Squares (RLS) algorithm, a forgetting factor $\rho \in (0,1)$ is introduced, and the following is minimized:

$$\vec{s}_{LS} = \min_{\vec{s}_{LS}} \sum_i \rho^{\frac{m-i}{2}} (\Lambda_i \vec{s}_{LS} - e_i)^2 \tag{17}$$

$$= \min_{\vec{s}_{LS}} \sum_i (\rho^{m-i} \Lambda_i \vec{s}_{LS} - e_i \rho^{m-i})^2$$

It is then clear that we can simply weight the rows of $\Lambda$ and the elements of $\vec{e}$, by $\rho^{m-i}$. So let $$\Lambda_{\rho^m} = \begin{pmatrix} \rho^{\frac{m}{2}} \Lambda_1 \\ \rho^{\frac{m-1}{2}} \Lambda_2 \\ \vdots \\ \Lambda_m \end{pmatrix}, \tag{18}$$

and $$\vec{e}_\rho^m = \left( e_1 \rho^{\frac{m}{2}}, e_2 \rho^{\frac{m-1}{2}}, \ldots, e_m \right)^T, \tag{19}$$

Then let $$\Xi_m = (\Lambda_{\rho^m}^T \Lambda_{\rho^m})^{-1} = \left( \sum_i \rho^{m-i} \Lambda_i^T \Lambda_i \right)^{-1}, \tag{20}$$

$$= (\rho \Xi_{m-1} + \Lambda_i^T \Lambda_i)^{-1},$$

and $$\vec{\xi}_m = \Lambda_\rho^m \vec{e}_\rho^m. \tag{21}$$

Using the Woodbury matrix identity, we get a well known update for the least squares system, which in our notation is $$\vec{\xi} = \rho \vec{\xi}_{m-1} + e_m \Lambda_m^T, \tag{22}$$

$$\Xi_m = \frac{1}{\rho} \Xi_{m-1} \left( I - \frac{\Lambda_m^T \Lambda_m}{\rho + \Lambda_m \Xi_{m-1} \Lambda_m^T} \Xi_{m-1} \right). \tag{23}$$

A major advantage of this update being, of course, that no matrix inversions are required.

The parameters for the ellipsoid fit are then obtained from $$\vec{s}_{LS} = \Xi_m \vec{\xi}_m. \tag{24}$$

As shown above, the chosen parameters for the ellipsoid are selected such that the ellipsoid is the "best" fit to the 3D field samples 130. Earlier we saw that the linear least squares problem differs from the sphere transformation problem essentially in the way different sample points are weighted. The introduction of the forgetting factor, $\rho$, then further obscures the impact of the linearization to the optimality of the solution.

5. Matrix Decomposition

Typically, the parameters for the ellipsoid fit are determined using Eq. 24. Then, the matrix B and bias vector $\vec{b}$ are obtained from equations (8)–(10) and from $$B = \frac{1}{c} A.$$

If the data is well distributed, this matrix, B, will be positive definite. Although the transformation matrix C from Eq. (14) is one possible solution to a transformation matrix, it turns out that there are innumerable matrices D such that $D^T D = B$. This is easy to see since any rotation matrix R satisfies $R^T R = I$ and $(RD)^T (RD) = D^T R^T RD = D^T D = B$. Out of these possible matrices D, we would like to select one that is somehow "fixed" and that may be used for transformation.

One suitable technique for fixing D is to select a matrix D such that $D\hat{x} = \lambda \hat{x}$, where $\lambda$ is an arbitrary constant and $\hat{x} = (1,0,0)^T$. This way, the x-axis of the sensor is never rotated by the calibration. We know then that $d_{21} = d_{31} = 0$. Also, since $D^T D = B$, we know that $d_{11} = \sqrt{b_{11}}$. So we have that the first column of D is $$\vec{d}_1 = \begin{pmatrix} \sqrt{b_{11}} \\ 0 \\ 0 \end{pmatrix} \tag{25}$$

The second column of D, $\vec{d}_2$, satisfies that $\vec{d}_1^T \vec{d}_2 = b_{12}$ and $\|\vec{d}_2\|^2 = b_{22}$. These alone do not uniquely determine $\vec{d}_2$, so we also require in this example that the last element of $\vec{d}_2$ be zero. This way, any rotation to the y-axis of the sensor is constrained to the x,y-plane. These conditions are satisfied by the vector $$\vec{d}_2 = \sqrt{b_{22}} \begin{pmatrix} \frac{b_{12}}{\sqrt{b_{11} b_{12}}} \\ \sqrt{1 - \frac{b_{12}^2}{b_{11} b_{22}}} \\ 0 \end{pmatrix}. \tag{26}$$

Finally, the third column is now subject to the constraints $\vec{d}_1^T \vec{d}_3 = b_{13}$, $\vec{d}_2^T \vec{d}_3 = b_{23}$, and $\|\vec{d}_3\|^2 = b_{33}$. Let $$\vec{d}_3 = \alpha \vec{d}_1 + \beta \vec{d}_2 + \gamma \hat{z}, \tag{27}$$

where $\hat{z}=(0,0,1)^T$. Then $$b_{13}=\vec{d}_1^T\vec{d}_3=\alpha b_{11}+\beta b_{12}, \quad (28)$$

$$b_{23}=\vec{d}_2^T\vec{d}_3=\alpha b_{12}+\beta b_{22}. \quad (29)$$

This system of linear equations will give $\alpha$ and $\beta$ when B is positive definite (because the determinant $b_{11}b_{22}-b_{12}^2$ has to be greater than zero in this example for positive definite matrices). Finally we get $$\vec{d}_3 = \begin{pmatrix} \alpha\sqrt{b_{11}} + \beta\frac{\sqrt{b_{22}}\,b_{12}}{\sqrt{b_{11}b_{22}}} \\ \beta\sqrt{b_{22} - \frac{b_{22}b_{12}^2}{b_{11}b_{22}}} \\ \sqrt{b_{33} - \left(\alpha\sqrt{b_{11}} + \beta\frac{\sqrt{b_{22}}\,b_{12}}{\sqrt{b_{11}b_{22}}}\right)^2 - \left(\beta\sqrt{b_{22}-\frac{b_{22}b_{12}^2}{b_{11}b_{22}}}\right)^2} \end{pmatrix} \quad (30)$$

The third element of $\vec{d}_3$ is simply selected such that $d_{13}^2+d_{23}^2+d_{33}^2=b_{33}$, and is simply $\sqrt{b_{33}-d_{13}^2-d_{23}^2}$. The matrix $D=[\vec{d}_1,\vec{d}_2,\vec{d}_3]$ now satisfies that $D^TD=B$. The matrix D can therefore be used as a transformation matrix and applied to samples in step 340 of FIG. 3.

It should be noted that in some conventional systems, the final calibration is separated into multiple matrices, one of which is used to remove linear dependence among the different axes. That matrix is called the decoupling matrix. In an exemplary embodiment of the disclosed invention, all the matrices are combined and thus the decoupling effect is included in the transformation matrix D. However, for instance in satellite systems, this decoupling portion may not be available exactly because the outside magnetic field changes during calibration. Thus, in other embodiments, the transformation matrix D can be modified to include multiple matrices, one of which would be a decoupling matrix.

An alternative technique for fixing D is to find the eigenvalue decomposition of B such that $B=U^*\Sigma U$, where $\Sigma$ is a diagonal matrix whose elements are the eigenvalues of B and the columns of U are the eigenvectors of B. Since B is symmetric and positive definite (i.e., unless the data are degenerate) the eigenvalues and eigenvectors are real, so $U^*=U^T$. Since $\Sigma^{1/2}$ is easy to compute, we would select $D=\Sigma^{1/2}U$. A (rotation) matrix R, such that $R^TR=I$, can be found such that RD is close to the identity matrix. One way to do this is to let $R=D^{-1}$ and then orthonormalize the rows of R, such as with the Gram-Schmidt method. The Gram-Schmidt method is guaranteed to not change the direction of the first processed row, and thus the corresponding row of RD is parallel to the corresponding coordinate axis. Said another way, if we start from the top, the first row of RD is parallel to the x-coordinate axis. Of course, some other orthonormalization method besides Gram-Schmidt may be used to guarantee the direction of a selected column of RD. In either of the above approaches to obtain R, the three column vectors of R are also orthonormalized.

It follows from the above derivation of R that not all rows will be orthogonal to all columns, because for a row of R and its corresponding column of D the vectors should be parallel (e.g., so that the diagonal elements of RD would be near the value of one and the off-diagonal elements near to the value zero within the constraint that R represents a rotoinversion. The transformation matrix applied (see step 340 of FIG. 3) to 3D field samples 130 would then be RD. The first more direct technique is superior to the eigenvalue decomposition technique in many ways.

Illustratively, the first technique is numerically more stable than most eigenvalue decomposition methods and likely to be computationally cheaper.

6. Convergence Considerations

The update formulas in Section 4 are generally guaranteed to give the best fitting ellipsoid with respect to the residuals minimized. However, when the 3D field samples 130 are degenerate, for example in a plane, the matrix B may not be invertible and the techniques above may fail to produce a meaningful transformation matrix D.

There should be some method of determining which samples are fed to the auto-calibration algorithm to reduce or eliminate the possibility of degenerate data. In an exemplary embodiment, orientation sensors such as gyroscopes and accelerometers may be relied upon to give an approximate idea of an orientation of an apparatus to help guarantee that 3D field samples 130 are well representative of an ellipsoid.

Figure 4:
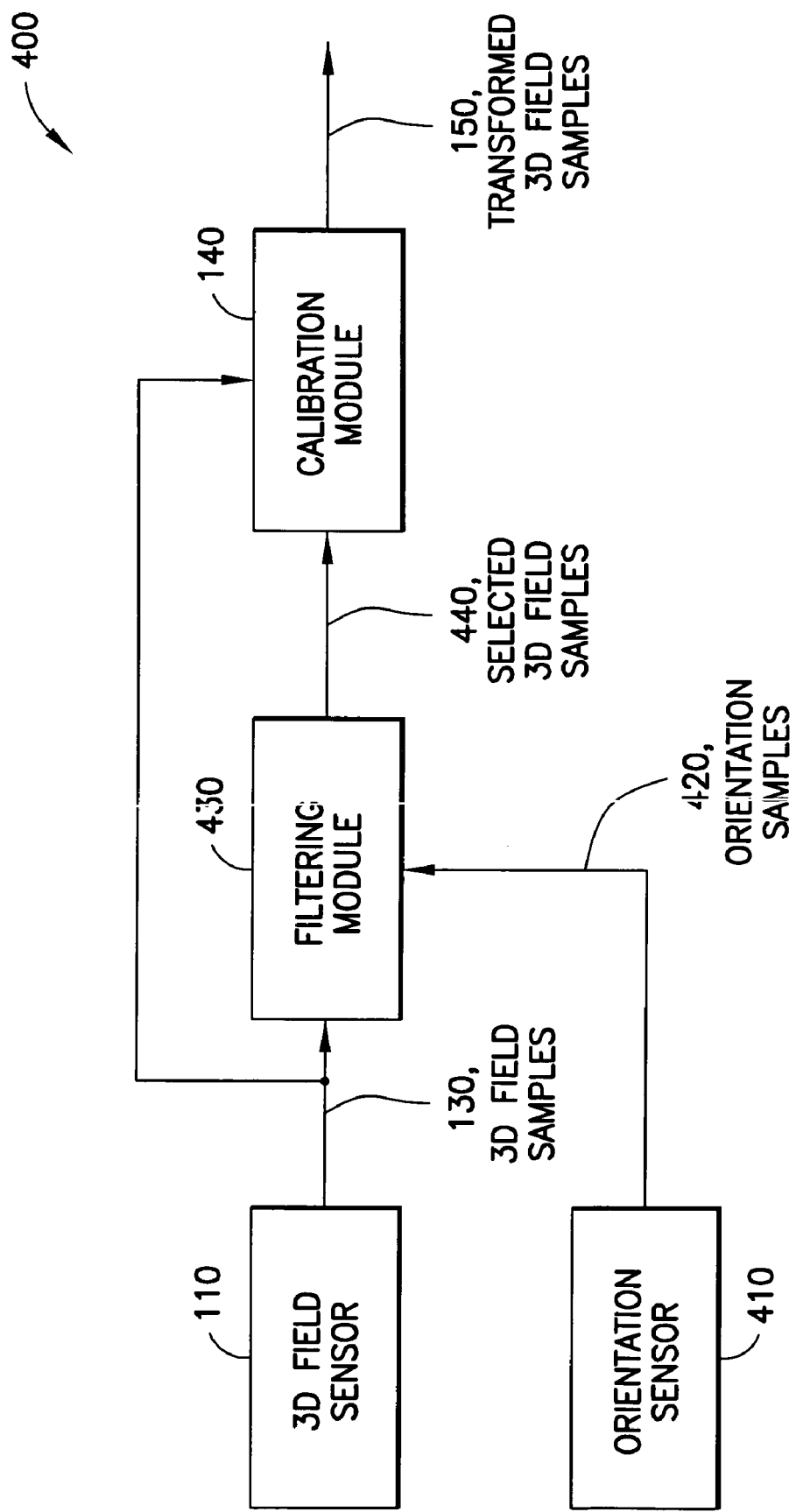
FIG. 4 is a block diagram of an exemplary apparatus for calibrating a 3D field sensor.

For instance, referring to FIG. 4, an exemplary apparatus 400 for calibrating a 3D field sensor 110 is shown. As in FIG. 2, the 3D field sensor 110 produces 3D field samples 130 and the calibration module 140 produces transformed 3D samples 150 using the 3D field samples 130. In the embodiment shown in FIG. 4, however, an orientation sensor 410 produces orientation samples 420. A filtering module 430 uses the orientation samples 420 to determine selected 3D field samples 440. Instead of using each 3D field sample 130 to perform calibration, the calibration module 140 uses only the selected 3D field samples 440 for calibration of the 3D field sensor 110. The filtering module 430 filters out some of the 3D field samples 130 so that the selected 3D field samples 440 that are passed to the calibration module 140 will decrease the likelihood of degenerate data used by the calibration module 140 during calibration.

The orientation sensor 410 can be one or several sensors that give orientation in three directions. For instance, one or more (typically three) gyroscopes or one or more (typically three) accelerometers may be used. Although the filtering module 430 is shown separately from the calibration module 140, portions or all of the filtering module 430 may be combined with the calibration module 140.

Figure 5:
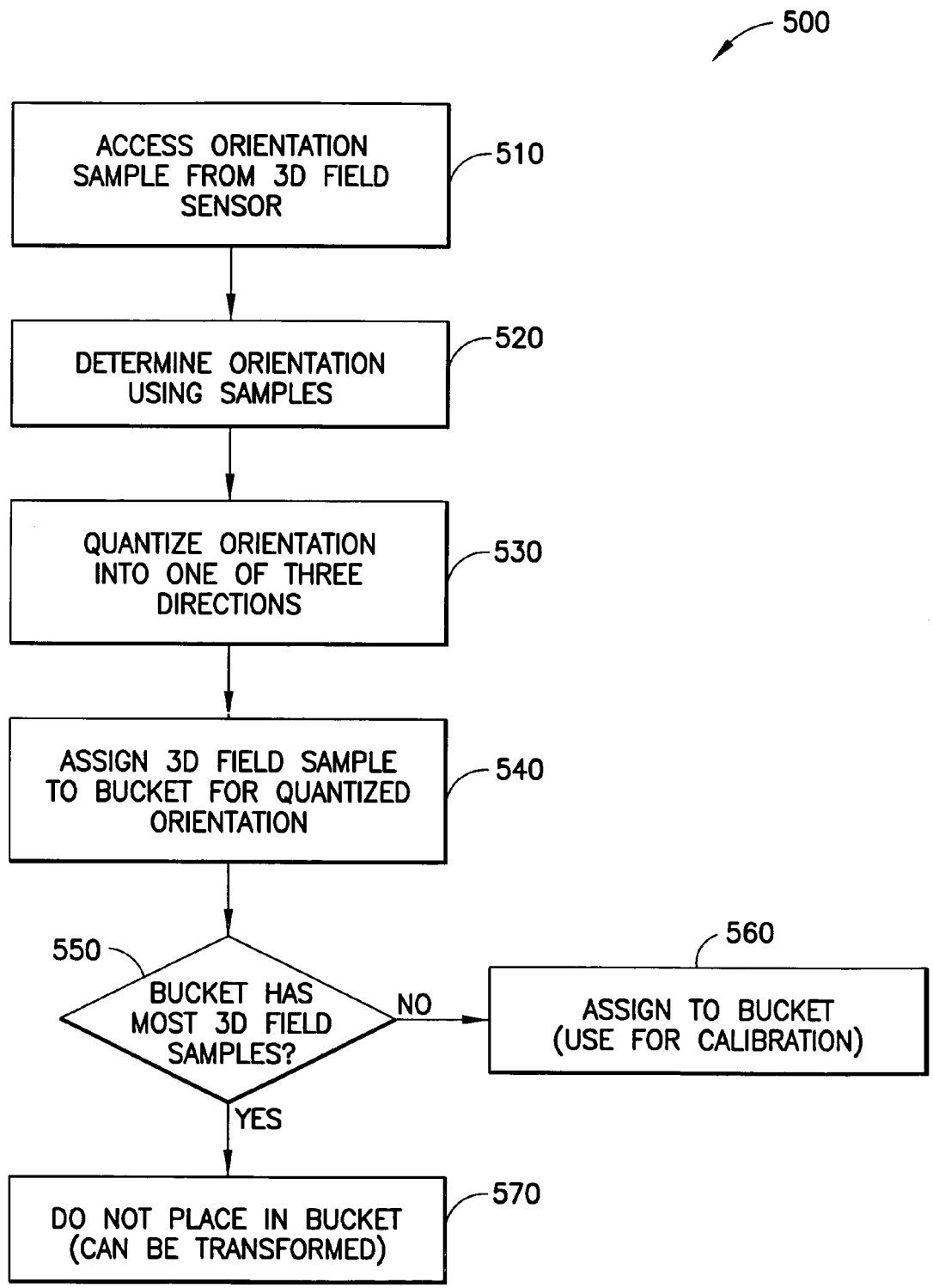
FIG. 5 is a flowchart of an exemplary method for filtering samples from a 3D field sensor.

Turning now to FIG. 5, a flowchart is shown of an exemplary method 500 for filtering samples from a 3D field sensor 110. Method 500 is performed in this example by the filtering module 430. In step 510, an orientation sample 420 is accessed from the 3D field sensor 510. The orientation sample 420 is accessed by the filtering module 430 directly from the orientation sensor 410, but may also be accessed from memory (see FIG. 6, for instance), or through any other technique for accessing a sample. In step 520, an orientation is determined from one or more of the orientation samples 420. For a set of three gyroscopes, step 520 is performed by integrating the angular velocity (e.g., in an orientation samples 420) from the gyroscopes to get an orientation. In step 530, the orientation from the gyroscopes is quantized to one of the three possible directions. Similar techniques could be used for other orientation sensors 410. Each possible direction is associated with one of three "buckets", which are used to hold selected 3D field samples 440 for calibration purposes. For calibration, all selected 3D field samples 440 in the buckets are used. For purposes of method 500, the buckets are used to reduce or prevent degenerate data.

In step 540, a current 3D field sample 130 (e.g., from a 3D field sensor 110 such as a magnetometer) is assigned to one of the buckets based on this 3 quantized orientation. Each 3D field sample 130 is assigned to one of the three buckets, each of which represents one of the three orthogonal axes. In step 550, it is determined if the bucket into which the current 3D field sample 130 is placed has the most 3D field samples. A 3D field sample 130 that would fall into the bucket that already has the most samples (step 550=YES) is not used for calibration or added to the buckets (step 570). The 3D field sample 130 may be transformed, however, On the other hand, a 3D field sample 130 that does not fall into the bucket that already has the most samples (step 550=NO) is assigned to a bucket and used for calibration by the calibration module 140 (step 560). The 3D field samples 130 in the set of three buckets may be used for calibration and maintained in a memory, for instance.

It is beneficial at this point to review information about orientation sensors. Gyroscopes, for instance, can be used to track orientation of a device with some accuracy, but there is the problem of drift. A 3D magnetometer and 3D accelerometer together constitute a kind of orientation sensor. If the direction of gravitation and the earth's magnetic field are known relative to the device, then one can deduce the orientation of the device "relative to earth". This is, of course, exactly what is being done herein with magnetometers and the reason why the magnetometers need to be calibrated somewhat accurately. The absolute orientation from the 3D magnetometer and 3D accelerometer can then be used to compensate for the drift in the gyroscopes. Gyroscopes on the other hand provide accurate tracking of fast movements, which is typically impossible with just the other two sensors. However, while a 3D accelerometer alone cannot give the orientation (e.g., because rotation around the axis of gravitation is invisible to the 3D accelerometer), a 3D accelerometer can give hints when the device surely has turned. So a 3D accelerometer would be another example of a sensor that could be used to select 3D field samples 440.

Although a gyroscope drifts, a gyroscope is still accurate enough to virtually guarantee that the data from the 3D field samples 130 will not be degenerate. If the range of the data (e.g., the 3D field samples 130 from the 3D field sensor 110) is well defined, it should be possible to devise a method to select the selected 3D field samples 440 for the calibration algorithm that would not need extra sensors in the orientation sensor 410.

7. Another Exemplary Embodiment

Turning now to FIG. 6, FIG. 6 is a block diagram of an apparatus 600 including a 3D field sensor 640 and modules (660, 670) for calibration of the 3D field sensor 110. In the example of FIG. 6, the apparatus 600 can be a mobile phone, a fitness monitoring device, a game controller, a wearable motion tracking device, or any device whose orientation in 3D space is of interest and which is rotated relatively frequently (e.g., enough to get an amount of 3D field samples 130 so that a ellipse can be fit to the 3D field samples 130).

Concerning the number 3D field samples 130 that can be used, in theory, one needs at least nine samples for the matrix ATA to be invertible. So nine samples are the minimum number of samples that can uniquely define an ellipsoid. In practice, one would probably need significantly more than that. In an exemplary implementation, a forgetting factor (e.g., $\rho$) of 0.95 was used, which results in a fairly fast adaptation. After 50 3D field samples 130 are used for calibration, the first sample has a corresponding weight of 0.077, so one would reason, then, that the first sample is practically completely forgotten after 50 samples. So the calibration is then basically based on the last 50 samples only, and 50 samples should certainly be enough. In an exemplary embodiment, the number of samples recommended would be somewhere between 10 and 50.

Apparatus 600 comprises a processor 610 that communicates with a memory 615, a 3D field sensor 620, and an orientation sensor 625. The memory 615 can be a static random access memory (RAM), dynamic RAM, registers, portions of a hard drive, or any memory that is readable and writable. Memory 615 comprises a calibration module 630, a filtering module 635, a current 3D field sample 640, orientation sample(s) 645, buckets of 3D field samples 650, a transformed 3D field sample 660, and a 3D application 665. The calibration module 630, filtering module 635, and 3D application 665 are implemented in this example as software (e.g., or firmware) comprising instructions and the instructions are loaded into memory 615 and executed by the processor 610. Processor 610 could be a general purpose processor, a digital signal processor, or any type of device suitable for executing instructions. The current 3D field sample 640 is transformed by the calibration module 630 into a transformed 3D field sample 660, which is used by 3D application 665. The 3D application 665 is any application that can use 3D information. The buckets of 3D field samples 650 contain three buckets (not shown), each of which contains selected 3D field samples, as described above in reference to FIGS. 4 and 5. The filtering module 635 is used as described above to filter 3D field samples for placement into the buckets of 3D field samples 650.

Portions or all of the filtering module 635 and the calibration module 630 could be combined, if desired. Additionally, the filtering module 635 and calibration module 630 could act on 3D field samples 130 and orientation samples 420 that have been previously determined and stored for later analysis.

Although being described in FIG. 6 as being software or firmware, calibration module 140 and filter module 430 may be implemented as software, firmware, hardware (e.g., discrete components that make up a circuit, an integrated circuit implemented on a semiconductor, and a programmable logic device), or some combination of these. It should be noted that the various blocks of the flow diagrams of FIGS. 3 and 5 might represent program steps, or interconnected logic circuits, blocks, and functions, or a combination of program steps and logic circuits, blocks and functions for performing the specified tasks. Furthermore, the disclosed invention may be implemented as a signal bearing medium tangibly embodying a program of machine-readable instructions executable by a processor to perform operations described herein.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. Nonetheless, all such and similar modifications of the teachings of this invention will still fall within the scope of this invention.

Furthermore, some of the features of the preferred embodiments of this invention could be used to advantage without the corresponding use of other features. As such, the foregoing description should be considered as merely illustrative of the principles of the present invention, and not in limitation thereof.

What is claimed is:

1. An apparatus-based method for calibration of a three-dimensional (3D) field sensor, comprising:
   accessing a plurality of samples, the samples from the 3D field sensor, each sample representing a magnitude and an orientation of a 3D field sensed by the 3D field sensor;
   using the plurality of samples, determining a plurality of parameters of an ellipsoid, wherein the determining the plurality of parameters is performed so that the ellipsoid fits the plurality of samples, wherein the following is used to represent the ellipsoid:
   $x^2+y^2+z^2-U(x^2+y^2-2z^2)-V(x^2-2y^2+z^2)-4Mxy-2Nxz-2Pyz-Qx-Ry-Sz-T=0$, and wherein determining a plurality of parameters determines the parameters $^sLS=(U,V,M,N,P,Q,R,S,T)^T$;
   determining a transformation that transforms the ellipsoid into a sphere;
   applying the transformation to a sample to create a transformed sample; and
   using the transformed sample to determine at least an orientation of the apparatus.

2. The method of claim 1, wherein determining a plurality of parameters further comprises performing least squares calculations using estimates of the plurality of parameters, wherein the plurality of parameters that are determined are the estimates that minimize error in the least squares calculations.

3. The method of claim 1, wherein the sphere is a unit sphere.

4. The method of claim 1, wherein each sample comprises one of (1) three field values representing values of the 3D field in three orthogonal directions and (2) values for the magnitude and direction of the 3D field.

5. The method of claim 1, wherein determining a transformation further comprises:
   determining a first matrix, D, suitable for transforming the ellipsoid into a sphere;
   determining a second matrix, R, such that $R^TR=I$, that makes a selected column of D parallel to a predetermined axis and RD close to some predetermined matrix; and
   applying the transformation further comprises applying the matrix, RD, to a difference between a sample and a bias.

6. The method of claim 1, wherein:
   determining a transformation further comprises determining a bias, the bias having a plurality of first values; and
   applying the transformation further comprises multiplying the transformation by a result of the first values of the bias subtracted from second values corresponding to the sample.

7. The method of claim 1, wherein determining a plurality of parameters further comprises performing a recursive least squares update using a currently selected sample to determine the plurality of parameters, wherein the recursive least squares update is also based on a plurality of previously selected samples.

8. The method of claim 7, wherein the recursive least squares update utilizes a forgetting factor.

9. The method of claim 7, wherein determining a transformation further comprises:
   determining a first matrix using the plurality of parameters; and
   decomposing the first matrix into a second matrix wherein a transpose of the second matrix multiplied by the second matrix is approximately equivalent to the first matrix, wherein the second matrix comprises the transformation.

10. The method of claim 9, wherein decomposing the first matrix further comprises determining the second matrix using the first matrix, the determining of the second matrix performed wherein a portion of the second matrix is constrained so that a predetermined axis is not rotated during the transformation.

11. The method of claim 1, wherein:
    the samples from the 3D field sensor are first field samples;
    the method further comprises selecting a plurality of second field samples from the first field samples;
    determining a plurality of parameters further comprises using the plurality of second field samples to determine the plurality of parameters of the ellipsoid, wherein determining the plurality of parameters is performed so that the ellipsoid fits the plurality of second field samples; and
    applying the transformation further comprises applying the transformation to at least one of a first field sample and a second field sample to create a transformed field sample.

12. The method of claim 11, wherein:
    selecting a plurality of second field samples from the first field samples further comprises:
      determining from at least one orientation sensor an orientation;
      quantizing the orientation into a given one of three directions, each direction corresponding to a bucket;
      based on a direction for the orientation, assigning a first field sample to a given bucket;
      determining whether a number of second samples already assigned to the given bucket is a largest number of second samples assigned to one of the three buckets; and
      in response to the number of second samples assigned to the given bucket being not the largest number of second samples assigned to one of the three buckets, assigning the first field sample to the given bucket as a second field sample; and
    determining a plurality of parameters further comprises using the plurality of second field samples in the buckets to determine the plurality of parameters of an ellipsoid, the determining the plurality of parameters performed so that the ellipsoid fits the plurality of second field samples.

13. The method of claim 12, wherein the at least one orientation sensor comprises at least one of a gyroscope and an accelerometer.

14. The method of claim 1, wherein the 3D field sensor comprises at least one of a magnetometer and an accelerometer.

15. The method of claim 1, wherein determining a transformation further comprises:
    determining a matrix $$A = \begin{pmatrix} 1-U-V & -2M & -N \\ -2M & 1-U+2V & -P \\ -N & -P & 1+2U-V \end{pmatrix};$$

determining a bias $$\vec{b} = \frac{1}{2}A^{-1}\begin{pmatrix} Q \\ R \\ S \end{pmatrix};$$

and determining a scaling factor $c = T + \vec{b}^T A \vec{b}$.

16. The method of claim 1, wherein determining the plurality of parameters of the ellipsoid further comprises determining the plurality of parameters using the formulation $\Lambda \vec{s}_{LS} = \vec{1}$, where the ith row of $\Lambda$ is as follows:

$x_i^2 + y_i^2 - 2z_i^2, x_i^2 - 2y_i^2 + z_i^2, 4x_iy_i, 2x_iz_i, 2y_iz_i, x_i, y_i, z_i, 1,$ where a sample comprises $(x_i, y_i, z_i)$.

17. The method of claim 1, wherein determining a transformation further comprises:

determining a matrix, A, a bias, $\vec{b}$, and a scaling factor, c in a representation of an ellipsoid of $(\vec{x} - \vec{b})^T A (\vec{x} - \vec{b}) = c$; and using the matrix, A, the bias, $\vec{b}$, and the scaling factor, c to determine the transformation.

18. The method of claim 1, wherein determining a transformation further comprises:

representing the ellipsoid using a symmetric matrix (A), a bias, and a scaling factor;
relating a matrix B to the symmetric matrix A; and
determining a matrix B* by minimizing a plurality of equations constrained to matrices B having predetermined traces.

19. The method of claim 18, wherein determining a transformation further comprises:

determining a matrix D using the matrix B*, the determining of D wherein a first predetermined axis of the 3D sensor is constrained so that the first predetermined axis is not rotated during transformation and wherein rotation to a second predetermined axis is constrained to a predetermined plane during transformation.

20. The method of claim 19, wherein each axis corresponds to a column of D and wherein a plurality of elements of D are related to elements of B* based on the constraints.

21. A computer-readable medium tangibly embodying a program of machine-readable instructions executable by a processor to perform operations for calibration of a three-dimensional (3D) field sensor, the operations comprising:

accessing a plurality of samples, the samples from the 3D field sensor, each sample representing a magnitude and an orientation of a three-dimensional field sensed by the 3D field sensor;

using the plurality of samples, determining a plurality of parameters of an ellipsoid, wherein the determining of the plurality of parameters is performed so that the ellipsoid fits the plurality of samples, wherein the following is used to represent the ellipsoid:

$x^2 + y^2 + z^2 - U(x^2 + y^2 - 2z^2) - V(x^2 - 2y^2 + z_2) - 4Mxy - 2Nxz - 2Pyz - Qx - Ry - Sz - T = 0$, and wherein determining a plurality of parameters determines the parameters $\vec{s}_{LS} = (U,V,M,N,P,Q,R,S,T)^T$;

determining a transformation that transforms the ellipsoid into a sphere;
applying the transformation to a sample to create a transformed sample; and
using the transformed sample to determine at least an orientation of the apparatus.

22. The computer-readable medium of claim 21, wherein determining a plurality of parameters further comprises performing least squares calculations using estimates of the plurality of parameters, wherein the plurality of parameters that are determined are the estimates that minimize error in the least squares calculations.

23. An apparatus, comprising:

means for measuring a three-dimensional (3D) field and for producing samples representing a magnitude and an orientation of the three-dimensional field;
means for accessing a plurality of samples from the means for measuring;
means, responsive to the plurality of samples, for determining a plurality of parameters of an ellipsoid, wherein the determining of the plurality of parameters is performed so that the ellipsoid fits the plurality of samples, wherein the following is used to represent the ellipsoid:

$x^2 + y^2 + z^2 - U(x^2 + y^2 - 2z^2) - V(x^2 - 2y^2 + z^2) - 4Mxy - 2Nxz - 2Pyz - Qx - Ry - Sz - T = 0$, and wherein determining a plurality of parameters determines the parameters $\vec{s}_{LS} = (U,V,M,N,P,Q,R,S,T)^T$;

means for determining a transformation that transforms the ellipsoid into a sphere;
means for applying the transformation to a sample to create a transformed sample; and
means for using the transformed sample to determine at least an orientation of the apparatus.

24. The apparatus of claim 23, wherein the means for determining a plurality of parameters further comprises means for performing least squares calculations using estimates of the plurality of parameters, wherein the plurality of parameters that are determined are the estimates that minimize error in the least squares calculations.

25. An apparatus, comprising:

a three-dimensional (3D) field sensor, the 3D field sensor adapted to produce field samples, each field sample representing a magnitude and an orientation of a 3D field sensed by the 3D field sensor;
a calibration module adapted to access a plurality of the field samples from the 3D field sensor, the calibration module adapted to use the plurality of samples to determine a plurality of parameters of an ellipsoid, wherein the determining the plurality of parameters operation is performed so that the ellipsoid fits the plurality of field samples, wherein the following is used to represent the ellipsoid:

$x^2 + y^2 + z^2 - U(x^2 + y^2 - 2z^2) - V(x^2 - 2y^2 + z^2) - 4Mxy - 2Nxz - 2Pyz - Qx - Ry - Sz - T = 0$, wherein the calibration module is adapted to determines the parameters $\vec{s}_{LS} = (U,V,M,N,P,Q,R,S,T)^T$, and wherein the calibration module is further adapted to determine a transformation that transforms the ellipsoid into a sphere and to apply the transformation to a field sample to create a transformed field sample; and an application configured to use the transformed sample to determine at least an orientation of the apparatus.

26. The apparatus of claim 25, wherein the calibration module is further adapted, when determining a transformation, to determine a first matrix using the plurality of parameters and to decompose the first matrix into a second matrix wherein a transpose of the second matrix multiplied by the second matrix is approximately equivalent to the first matrix, wherein the second matrix comprises the transformation.

27. The apparatus of claim 26, wherein the calibration module is further adapted, when decomposing the first matrix, to determine the second matrix using the first matrix, the determining of the second matrix performed wherein a portion of the second matrix is constrained so that a predetermined axis is not rotated during the transformation.

28. The apparatus of claim 25, wherein the calibration module, when determining a plurality of parameters, is further adapted to perform least squares calculations using estimates of the plurality of parameters, wherein the plurality of parameters that are determined are the estimates that minimize error in the least squares calculations.

29. The apparatus of claim 25, further comprising a memory, and wherein the calibration module is adapted to access the plurality of field samples from the 3D field sensor by accessing the memory.

30. The apparatus of claim 25, further comprising:
a filtering module coupled to the calibration module and adapted to select field samples for use by the calibration module to determine the plurality of parameters of the ellipsoid, wherein the calibration module is further adapted to apply the transform to at least one of an unselected field sample and a selected field sample.

31. The apparatus of claim 30, wherein:
the apparatus further comprises an orientation sensor adapted to produce orientation samples; and
the filtering module is further adapted to access the orientation samples from the orientation sensor, to quantize a given orientation sample into one of three directions, and to choose a field sample corresponding as a selected field sample based on the one direction.

32. The apparatus of claim 31, wherein the filtering module is further adapted using an orientation and a corresponding direction to place selected field samples into buckets corresponding to the three directions and to choose a given field sample as a selected field sample when the bucket into which the given field sample is to be placed does not have a highest number of selected field samples of the three buckets.

33. The apparatus of claim 32, wherein the orientation sensor comprises at least one of a gyroscope and an accelerometer.

34. The apparatus of claim 25, wherein the apparatus comprises one of a mobile phone, a fitness monitoring device, a game controller, and a wearable motion tracking device.

35. The apparatus of claim 25, wherein the 3D field sensor comprises at least one of a magnetometer and an accelerometer.

36. The apparatus of claim 25, wherein the sphere is a unit sphere.

37. A method comprising:
accessing a plurality of samples, the samples from the 3D field sensor, each sample representing a magnitude and an orientation of a 3D field sensed by the 3D field sensor;
using the plurality of samples, determining a plurality of parameters of an ellipsoid, wherein the determining the plurality of parameters is performed so that the ellipsoid fits the plurality of samples;
determining a transformation that transforms the ellipsoid into a sphere, wherein determining a transformation comprises:
determining a first matrix, a bias, and a scaling factor, in a representation of an ellipsoid, wherein the first matrix comprises the plurality of parameters;
determining a second matrix, where a multiplication of a transposition of the second matrix by the second matrix is equivalent to the first matrix divided by the scaling factor, where the second matrix is selected such that a selected axis of the 3D field sensor remains fixed as additional samples are used to determine the transformation, and where the transformation comprises the second matrix;
applying the transformation to a sample to create a transformed sample; and
using the transformed sample to determine at least an orientation of the apparatus.

38. The method of claim 37, wherein the following is used to represent the ellipsoid:
$x^2+y^2+z^2-U(x^2+y^2-2z^2)-V(x^2-2y^2+z^2)-4Mxy-2Nxz-2Pyz-Qx-Ry-Sz-T=0$, and wherein determining a plurality of parameters determines the parameters $\vec{s}_{LS}=(U,V,M,N,P,Q,R,S,T)^T$.

39. An apparatus, comprising:
a three-dimensional (3D) field sensor, the 3D field sensor configured to produce field samples, each field sample representing a magnitude and an orientation of a 3D field sensed by the 3D field sensor; and
a calibration module configured to access a plurality of the field samples from the 3D field sensor, the calibration module adapted to use the plurality of samples to determine a plurality of parameters of an ellipsoid, wherein the determining the plurality of parameters operation is performed so that the ellipsoid fits the plurality of field samples, wherein the calibration module is further configured determine a transformation that transforms the ellipsoid into a sphere by determining a first matrix, a bias, and a scaling factor, in a representation of an ellipsoid, wherein the first matrix comprises the plurality of parameters, and by determining a second matrix, where a multiplication of a transposition of the second matrix by the second matrix is equivalent to the first matrix divided by the scaling factor, where the second matrix is selected such that a selected axis of the 3D field sensor remains fixed as additional samples are used to determine the transformation, and where the transformation comprises the second matrix, and wherein the calibration module is further configured to apply the transformation to a field sample to create a transformed field sample; and
an application configured to use the transformed sample to determine at least an orientation of the apparatus.

40. The apparatus of claim 39, wherein the apparatus comprises one of a mobile phone, a fitness monitoring device, a game controller, and a wearable motion tracking device.

* * * * *

UNITED STATES PATENT AND TRADEMARK OFFICE
CERTIFICATE OF CORRECTION

PATENT NO. : 7,275,008 B2 Page 1 of 1
APPLICATION NO. : 11/251434
DATED : September 25, 2007
INVENTOR(S) : Timo Pekka Pylvänäinen It is certified that error appears in the above-identified patent and that said Letters Patent is hereby corrected as shown below:

On the title page in the Bibliographic data, page 1, delete "Timo Pekka Plyvänäinen" and replace with --Timo Pekka Pylvänäinen--.

In Claim 1: Column 15, line 22, delete

" $\vec{s} LS = (U,V,M,N,P,Q,R,S,T)^T$ " and replace with

-- $\vec{s}_{LS} = (U,V,M,N,P,Q,R,S,T)^T$ -- as indicated in Claim 1 amended in the Response filed November 13, 2006.

In Claim 16: Column 17, line 24, delete

" $x_i^2 + y_i^2 - 2z_i^2, x_i^2 - 2y_i^2 + z_i^2, 4x_iy_i, 2x_iz_i, 2y_iz_i, z_i, y_i, z_i, 1$ " and replace with -- $x_i^2 + y_i^2 - 2z_i^2, x_i^2 - 2y_i^2 + z_i^2, 4x_iy_i, 2x_iz_i, 2y_iz_i, x_i, y_i, z_i, 1$ -- as indicated in claim 15 amended in the Response filed November 13, 2006.

Signed and Sealed this

Eighteenth Day of March, 2008

JON W. DUDAS
*Director of the United States Patent and Trademark Office*